United States Patent
Lin et al.

(10) Patent No.: US 11,756,972 B2
(45) Date of Patent: Sep. 12, 2023

(54) APPARATUS FOR REDUCING OPTICAL CROSS-TALK IN IMAGE SENSORS

(71) Applicant: Taiwan Semiconductor Manufacturing Company, Ltd., Hsinchu (TW)

(72) Inventors: Chin-Min Lin, Hsinchu County (TW); Ching-Chun Wang, Tainan (TW); Dun-Nian Yaung, Taipei (TW); Chun-Ming Su, Kaohsiung (TW); Tzu-Hsuan Hsu, Cianjhen District (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 5 days.

(21) Appl. No.: 17/371,279

(22) Filed: Jul. 9, 2021

(65) Prior Publication Data
US 2021/0335871 A1 Oct. 28, 2021

Related U.S. Application Data

(60) Continuation of application No. 16/721,288, filed on Dec. 19, 2019, now Pat. No. 11,069,731, which is a continuation of application No. 15/964,526, filed on Apr. 27, 2018, now Pat. No. 10,522,586, which is a continuation of application No. 15/647,968, filed on Jul. 12, 2017, now Pat. No. 9,966,412, which is a continuation of application No. 15/295,703, filed on Oct. 17, 2016, now Pat. No. 9,711,562, which is a
(Continued)

(51) Int. Cl.
*H01L 27/146* (2006.01)
*H04N 23/10* (2023.01)
*H04N 25/13* (2023.01)

(52) U.S. Cl.
CPC .... *H01L 27/14621* (2013.01); *H01L 27/1464* (2013.01); *H01L 27/14623* (2013.01); *H01L 27/14627* (2013.01); *H01L 27/14643* (2013.01); *H01L 27/14685* (2013.01); *H04N 23/10* (2023.01); *H04N 25/134* (2023.01)

(58) Field of Classification Search
CPC ......... H01L 27/14685; H01L 27/14261; H01L 27/14623; H01L 27/14627; H01L 27/1464
USPC .............................. 257/432, 31.127; 438/69
See application file for complete search history.

(56) References Cited

U.S. PATENT DOCUMENTS 6,414,343 B1   7/2002   Kondo et al.
6,765,638 B1   7/2004   Masuzawa
(Continued)

OTHER PUBLICATIONS

Chinese Patent Office, Office Action dated Aug. 7, 2009, Application No. 2007101969169, 5 pgs.

*Primary Examiner* — Matthew E. Gordon
(74) *Attorney, Agent, or Firm* — HAYNES AND BOONE, LLP

(57) ABSTRACT

According to one example, a device includes a semiconductor substrate. The device further includes a plurality of color filters disposed above the semiconductor substrate. The device further includes a plurality of micro-lenses disposed above the set of color filters. The device further includes a structure that is configured to block light radiation that is traveling towards a region between adjacent micro-lenses. The structure and the color filters are level at respective top surfaces and bottom surfaces thereof.

20 Claims, 8 Drawing Sheets

Related U.S. Application Data division of application No. 13/692,104, filed on Dec. 3, 2012, now Pat. No. 9,473,753, which is a continuation of application No. 11/779,122, filed on Jul. 17, 2007, now abandoned.

(56) References Cited

U.S. PATENT DOCUMENTS

| | | |
|---|---|---|
| 6,831,622 B2 | 12/2004 | Aoki |
| 7,078,779 B2 | 7/2006 | Wang et al. |
| 7,515,125 B2 | 4/2009 | Yamazaki et al. |
| 7,579,639 B2 | 8/2009 | Jung |
| 7,684,868 B2 | 3/2010 | Tai et al. |
| 8,183,603 B2 | 5/2012 | Maruyama et al. |
| 9,473,753 B2 | 10/2016 | Lin et al. |
| 9,711,562 B2 | 7/2017 | Lin et al. |
| 9,966,412 B2 | 5/2018 | Lin et al. |
| 10,522,586 B2 | 12/2019 | Lin et al. |
| 2003/0116802 A1 | 6/2003 | Yamazaki et al. |
| 2003/0151713 A1 | 8/2003 | Aoki |
| 2005/0184392 A1 | 8/2005 | Chen |
| 2006/0081898 A1 | 4/2006 | Wang et al. |
| 2006/0121639 A1 | 6/2006 | Tai et al. |
| 2006/0125020 A1* | 6/2006 | Jung ................ H01L 27/14685 257/369 |
| 2006/0132401 A1 | 6/2006 | Yamazaki et al. |
| 2006/0138485 A1 | 6/2006 | Jung |
| 2007/0210395 A1* | 9/2007 | Maruyama ........ H01L 27/14609 257/431 |
| 2007/0215912 A1* | 9/2007 | Kido ................ H01L 27/14641 257/257 |
| 2017/0040378 A1 | 2/2017 | Lin et al. |

* cited by examiner

APPARATUS FOR REDUCING OPTICAL CROSS-TALK IN IMAGE SENSORS

PRIORITY INFORMATION

This application is a continuation of U.S. patent application Ser. No. 16/721,288 filed Dec. 19, 2019 and entitled "Apparatus for Reducing Optical Cross-Talk in Image Sensors," which is a continuation of U.S. patent application Ser. No. 15/964,526 filed Apr. 27, 2018 and entitled "Apparatus for Reducing Optical Cross-Talk in Image Sensors," which is a continuation of U.S. patent application Ser. No. 15/647,968 filed Jul. 12, 2017 and entitled "Method for Reducing Optical Cross-Talk in Image Sensors," now U.S. Pat. No. 9,966,412 issued May 8, 2018, which is a continuation of U.S. patent application Ser. No. 15/295,703 filed Oct. 17, 2016 and entitled "Apparatus and Method for Reducing Optical Cross-talk in Image Sensors," now U.S. Pat. No. 9,711,562 issued Jul. 18, 2017, which is a divisional of U.S. patent application Ser. No. 13/692,104 filed Dec. 3, 2012, and entitled "Apparatus and Method for Reducing Optical Cross-talk in Image Sensors," now U.S. Pat. No. 9,473,753 issued Oct. 18, 2016, which is a continuation of U.S. patent application Ser. No. 11/779,122, filed on Jul. 17, 2007, the disclosures of which are hereby incorporated by reference in their entirety.

BACKGROUND

The present disclosure relates generally to image sensor devices and, more particularly, to an apparatus and method for reducing optical crosstalk in image sensor devices.

An image sensor provides a grid of pixels which may contain photosensitive diodes or photodiodes, reset transistors, source follower transistors, pinned layer photodiodes, and/or transfer transistors for recording intensity or brightness of light. The pixel responds to the light by accumulating photo-charges—the more light, the more the photo-charges. The charges can then be used by another circuit so that a color and brightness can be used for a suitable application, such as a digital camera. Common types of pixel grids include a charge-coupled device (CCD), a complimentary metal oxide semiconductor (CMOS) image sensor (CIS), an active-pixel sensor (APS), and a passive-pixel sensor.

In order to capture color information, image sensors may employ a color filter layer that incorporates several different color filters (e.g., red, green, and blue), and are positioned such that the incident light is directed through the filter via an array of micro-lens. However, the micro-lens may exhibit poor light control ability at a region between adjacent micro-lens. That is, incident light traveling through this region may not be directed to the appropriate pixel for processing. This may result in optical cross-talk between adjacent pixels and thus, may lead to poor device performance.

Therefore, what is needed is a simple and cost-effective apparatus and method for reducing optical cross-talk in image sensor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
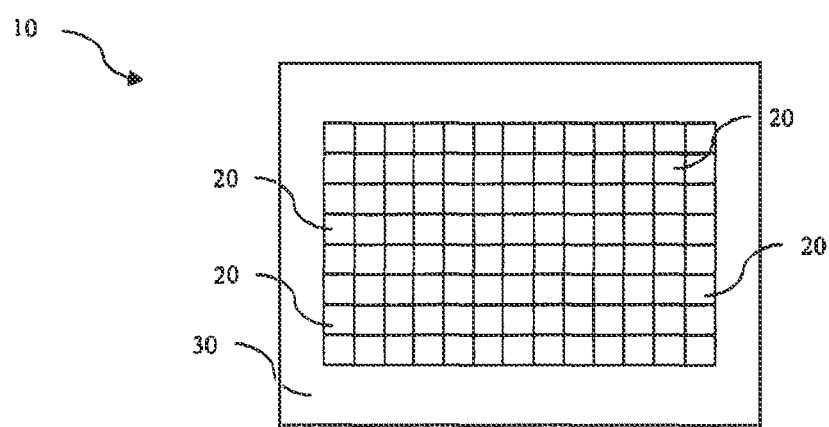
FIG. 1 is a top view of an image sensor including a plurality of pixels.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a top view of an image sensor 10 including a plurality of pixels 20. Additional circuitry and input/outputs 30 are typically provided adjacent to the grid of pixels 20 for providing an operation environment for the pixels and for supporting external communications with the pixels. The image sensor 10 may include a charge-coupled device (CCD), complementary metal oxide semiconductor (CMOS) image sensor (CIS), an active-pixel sensor (APS), and a passive-pixel sensor.

Figure 2A:
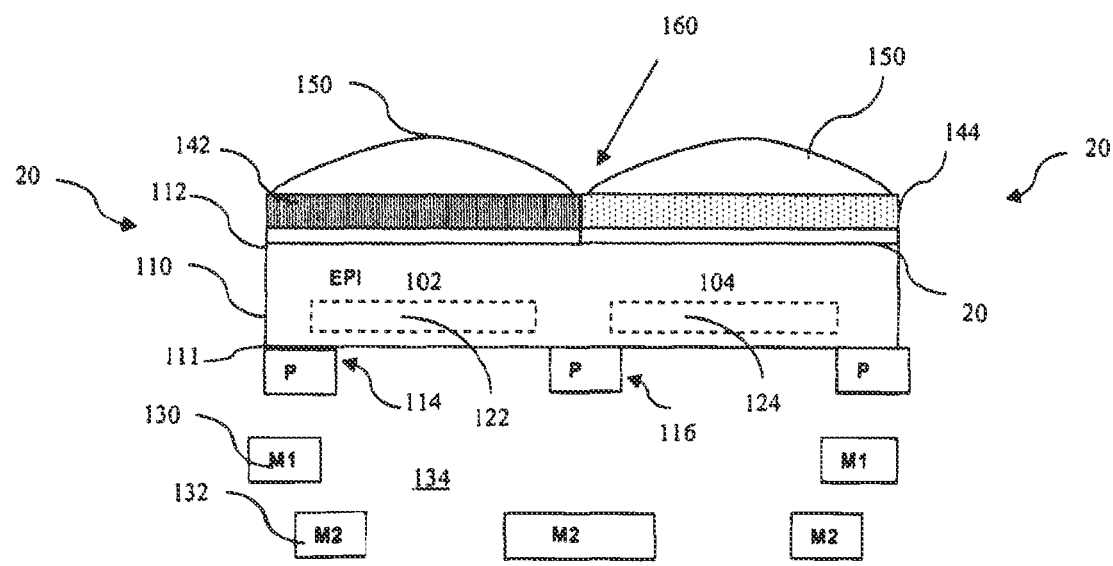
FIGS. 2A and 2B are cross-sectional and top views, respectively, of part of the image sensor of FIG. 1.
Figure 2B:
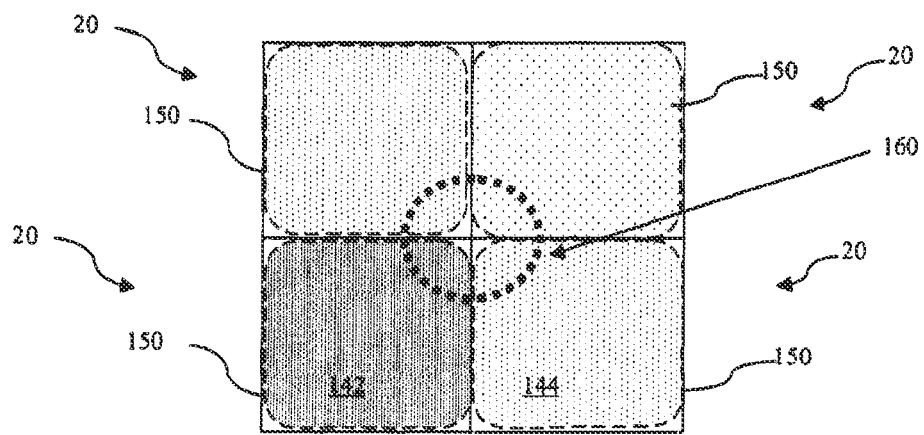

Referring to FIGS. 2A and 2B, illustrated are cross-sectional and top views, respectively, of two adjacent pixels 20 of the image sensor 10 FIG. 1. In the present example, the adjacent pixels include a first pixel 102 and a second pixel 104 for sensing visible light. It is understood that the use of visible light is a mere example and that other types of radiation such as infrared (IR), microwave, X-ray, and ultraviolet (UV) may be used in other types of applications. The pixels 102 and 104 may be formed on a semiconductor substrate 110. The substrate 110 may include a front surface 111 and a back surface 112. The substrate 110 may comprise an elementary semiconductor such as silicon, germanium, and diamond. Alternatively, the substrate 110 may optionally comprise a compound semiconductor such as silicon carbide, gallium arsenic, indium arsenide, and indium phosphide. Additionally, semiconductor substrate types such as silicon-on-insulator (SOI) and/or an epitaxial layer may be utilized.

The pixels 102 and 104 may each comprise of a photodiode and at least one transistor 114 and 116 for sensing and recording an intensity of light. An example of a photodiode that can be used in this embodiment is shown in U.S. patent application Ser. No. 11/291,880, filed on Dec. 1, 2005, which is hereby incorporated by reference. For example, the substrate 110 may comprises a P-type silicon. A silicon epitaxial layer (epilayer or epi) may be grown on the substrate 110 by a method such as chemical vapor deposition (CVD). The epilayer may have a lower concentration of dopant than that of the heavily doped P-type silicon substrate 110. The photodiode includes a light-sensing region which in the present embodiment is an N-type doped region 122 and 124 having dopants formed in the silicon epilayer. All doping may be implemented using a process such as ion implantation or diffusion in various steps and techniques. It is understood that all doping may be reversed accordingly such as providing an N-type silicon substrate having an epilayer with a P-type light-sensing region.

The substrate 110 may also comprise lateral isolation features (not shown) such as shallow trench isolation (STI) features to separate the pixels and/or other devices formed on the substrate. These other devices may include various doped regions each having an N-type or P-type, such as an N-well or P-well. Even though the present example describes a photodiode, it is understood that other types of pixels may be used. Other types of pixels include, but are not limited to, pinned photodiodes, photo transistors (e.g., p/n/p or n/p/n), and photogates. Additionally, configurations such as a 4T active pixel including a photodiode and four transistors (e.g., transfer gate transistor, reset transistor, source follower transistor, and select transistor) or pixel types using 4T operating concepts (e.g., sharing reset transistor and source follower transistor for several pixels) may be used for the pixels. Additional circuitry also exists to provide an appropriate functionality to handle the type of pixels 100 being used and the type of light being sensed.

The image sensor 10 includes a plurality of interconnect metal layers including first and second interconnect metal layers 130 and 132, respectively, overlying the pixels 102 and 104. The metal layers 130 and 132 may be used for interconnecting various devices formed on the substrate 110. The metal layers 130 and 132 may comprise of conductive materials such as aluminum, aluminum alloy, copper, copper alloy, titanium, titanium nitride, tungsten, polysilion, metal silicide, and/or combinations thereof. The image sensor 10 may further include an inter-metal dielectric 134 for insulating the interconnecting metal layers 130 and 132 disposed therein. The inter-metal dielectric 134 may comprise of a low-k dielectric material such as a material having a dielectric constant (k) less than about 3.5. The inter-metal dielectric 134 may comprise of carbon-doped silicon oxide, fluorine-doped silicon oxide, silicon nitride, silicon oxynitride, polymide, spin-on glass, amorphous fluorinated carbon, and/or other suitable materials. Even though two metal layers 130 and 132 and inter-metal dielectric 134 is disclosed herein for clarity and simplicity, it is understood that multiple metal layers and inter-metal dielectric are typically used in an image sensor device.

The image sensor 10 further includes a color filter layer overlying the back surface 112 of the substrate 110. In the present example, the color filter layer includes a first color filter 142 for filtering through visible light of a first wavelength (e.g., red, blue, green light) to the first pixel 102, and a second color filter 144 for filtering through visible light of a second wavelength (e.g., red, blue, green light) to the second pixel 104. The color filters 142 and 144 may comprise of a dye-based (or pigment-based) polymer for filtering out a specific frequency band (e.g., desired wavelength of light). Alternatively, the color filters 142 and 144 may optionally comprise of a resin or other organic-based material having color pigments.

The image sensor 10 further includes a plurality of micro-lens 150. The micro-lens 150 may be positioned in various arrangements overlying the color filters 142 and 144 and pixels 102 and 104. The micro-lens 150 may have a variety of shapes depending on the refractive index of material used for the micro-lens and the distance from the sensor surface to the micro-lens.

In operation, the image sensor 10 is designed to receive light radiation traveling towards the back surface 112 of the semiconductor substrate 110. The visible light is directed towards the color filters 142 and 144 by the micro-lens 150. The light passing through to the color filters 142 and 144 and pixels 102 and 104 may be maximized since the light is not obstructed by various device features (e.g., gates electrodes) or metal features (e.g., the metal layers 130 and 132) overlying the front surface 111 of the substrate 110. The desired wavelength of light (e.g., red, green, blue light) that is allowed to pass through to the respective pixel 102 and 104, induces a photocurrent which may be recorded and processed. However, there is a region 160 between adjacent micro-lens 150 where the micro-lens exhibit poor light control ability. That is, light traveling through this region 160 may not be directed to the appropriate pixel for processing. As such, optical cross-talk between adjacent pixels may occur and thus, may lead to poor device performance.

Figure 3:
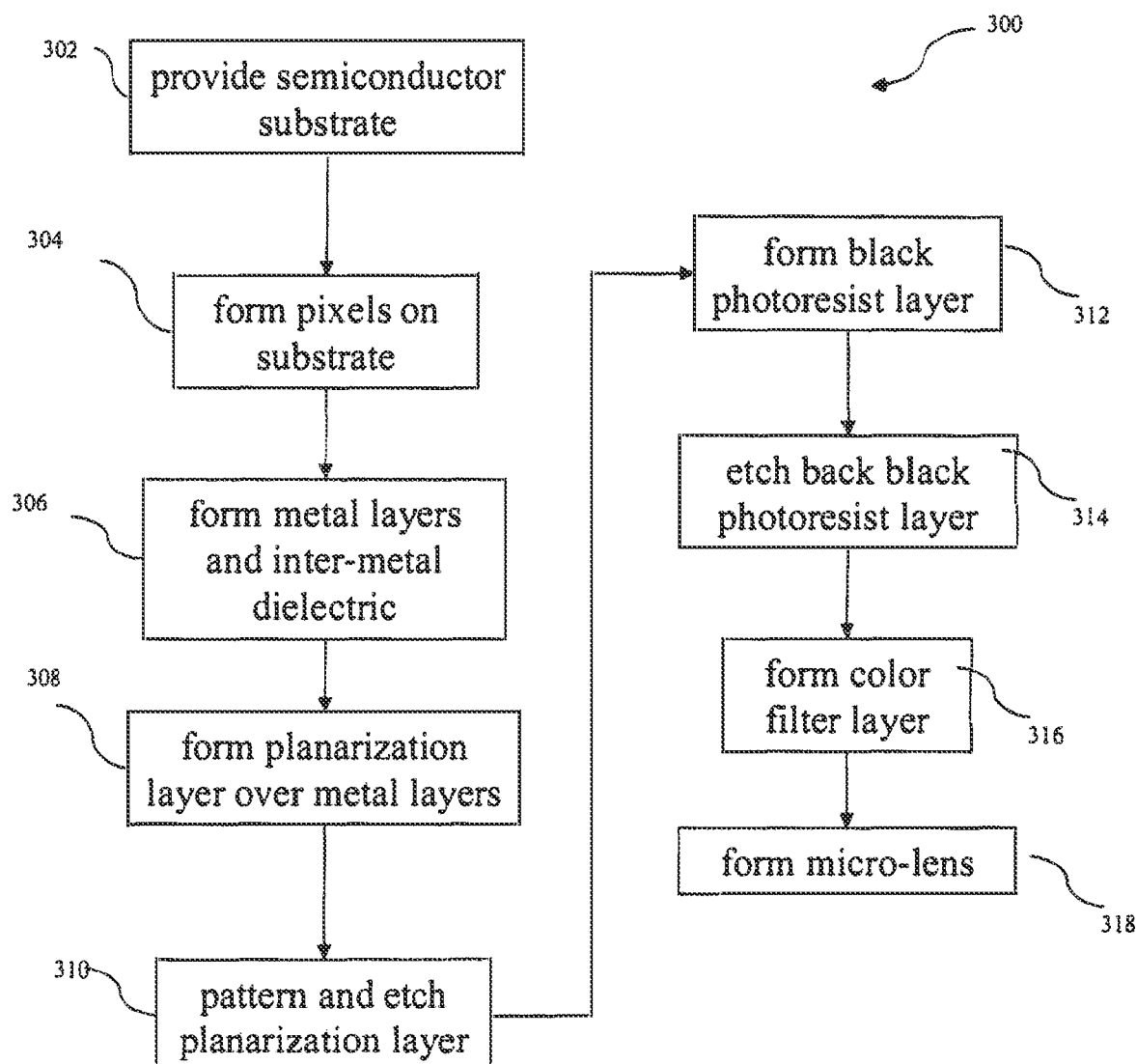
FIG. 3 is a flowchart of a method of making a back-side illuminated sensor that embodies various aspects of the present disclosure.

Referring to FIGS. 3, and 4A through 4C, illustrated are a flowchart of a method 300 for making a back-side illuminated image sensor device 400, and cross-sectional views of the image sensor 400 being processed at various stages according to the method 300. The image sensor 400 of FIG. 4 is similar to the image sensor 10 of FIGS. 1-2 except for the features disclosed below. Similar features in FIGS. 4 and 1-2 are numbered the same for clarity. In FIG. 3, the method 300 begins with process 302 in which a semiconductor substrate 110 may be provided with a front surface 111 and a back surface 112. The substrate 110 may include an epilayer formed thereon. The method 300 continues with process 304 in which a plurality of pixels 102 and 104 may be formed on the substrate 110, each pixel having a light-sensing element 122 and 124 such as a photodiode, and at least one transistor 114 and 116. The process of forming the pixels is known in the art and thus, not described in detail here.

The method 300 continues with process 306 in which interconnect metal layers 130 and 132 and an inter-metal dielectric 134 may be formed over the substrate 110. The process of forming the interconnect metal layers and inter-metal dielectric is known in the art and thus, not described in detail here. The method 300 continues with process 308 in which a planarization layer 402 may be formed over the back surface 112 of the substrate 110. The planarization layer 402 may include silicon oxide. Alternatively, the planarization layer 402 may optionally include silicon nitride, silicon oxynitride, or other suitable material. The planaratization layer 402 may be formed by a suitable deposition or spin-coating process known in the art. The method 300 continues with process 310 in which the planarization layer 402 may be patterned by photolithography and etched to define open regions 404 and 406 within the planarization layer. The open regions 404 and 406 may have a width of about 0.2 µm. Alternatively, the open regions 404 and 406 may optionally have a width smaller than 0.2 µm.

Figure 4A:
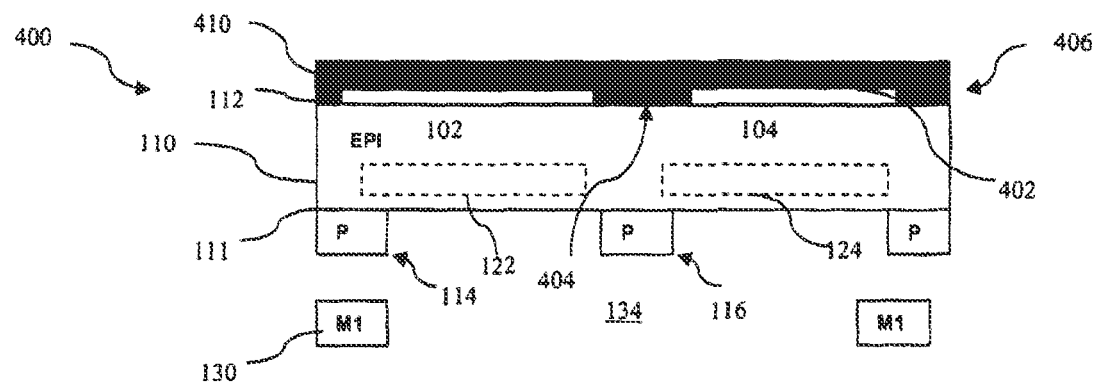
FIGS. 4A, 4B, and 4C are cross-sectional views of the back-side illuminated image sensor being processed according to the method of FIG. 4.
Figure 4B:
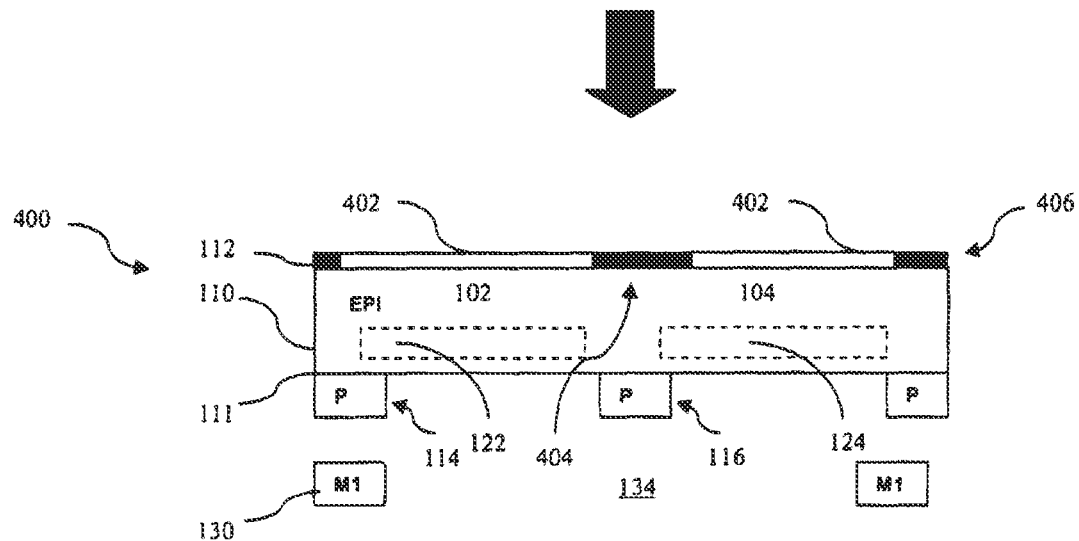

In FIG. 4A, the method 300 continues with process 312 in which a black photoresist layer 410 may be formed over the patterned planarization layer 402. Accordingly, the black photoresist layer 410 may fill in the regions 404 and 406 within the planarization layer 402. The black photoresist layer 410 may be formed by a deposition process, spin-coating process, or other suitable process. Alternatively, other suitable opaque materials may optionally be used instead of the black photoresist. In FIG. 4B, the method 300 continues with process 314 in which the black photoresist layer 410 may be etched back until the planarization layer 402 is exposed. The etch back process includes an etching species that selectively removes the black photoresist layer 410 and uses the planarization layer 402 as an etch stop layer.

Figure 4C:
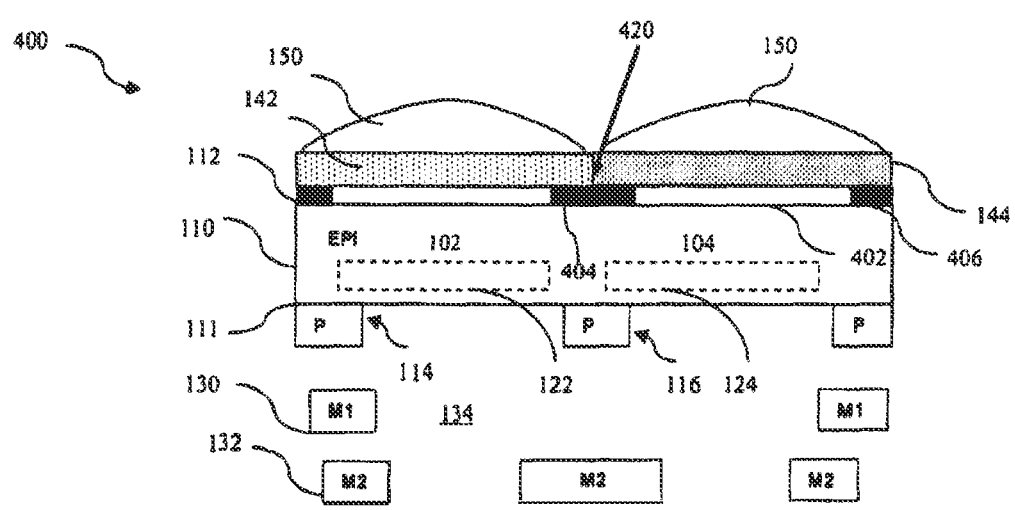

In FIG. 4C, the method 300 continues with process 316 in which a color filter layer including color filters 142 and 144 may be formed over the patterned planarization layer 402. The color filter layer may be configured such that a region between adjacent color filters 142 and 144 substantially overlies the regions 404 and 406 within the planarization layer 402 that are filled with the black photoresist. The method 300 continues with process 318 in which a plurality of micro-lens 150 may be formed over the color filter layer. The micro-lens 150 are configured to direct light radiation traveling towards the back surface 112 of the substrate 110 to the corresponding pixels 102 and 104. The micro-lens 150 may be configured such that a region between adjacent micro-lens 150 substantially overlies the regions 404 and 406 within the planarization layer 402 that are filled with the black photoresist.

In operation, the image sensor 400 is designed to receive light radiation traveling towards the back surface 112 of the semiconductor substrate 110. The light is directed towards the color filters 142 and 144 by the micro-lens 150. The light passing through to the color filters 142 and 144 and pixels 102 and 104 may be maximized since the light is not obstructed by various device features (e.g., gates electrodes) or metal features (e.g., the metal layers 130 and 132) overlying the front surface 111 of the substrate 110. The desired wavelength of light (e.g., red, green, blue light) that is allowed to pass through to the respective pixel 102 and 104, induces a photocurrent which may be recorded and processed. There is a region 420 between adjacent micro-lens 150 where the micro-lens exhibit poor light control ability. That is, light traveling through this region 420 may not be directed to the appropriate pixel for processing. However, in the present embodiment, the light traveling through this region 420 may be shielded or blocked by the regions 404 and 406 within the planarization layer 402 that are filled with the black photoresist. As such, the regions 404 and 406 within planarization layer 402 may minimize optical cross-talk between adjacent pixels.

Figure 5:
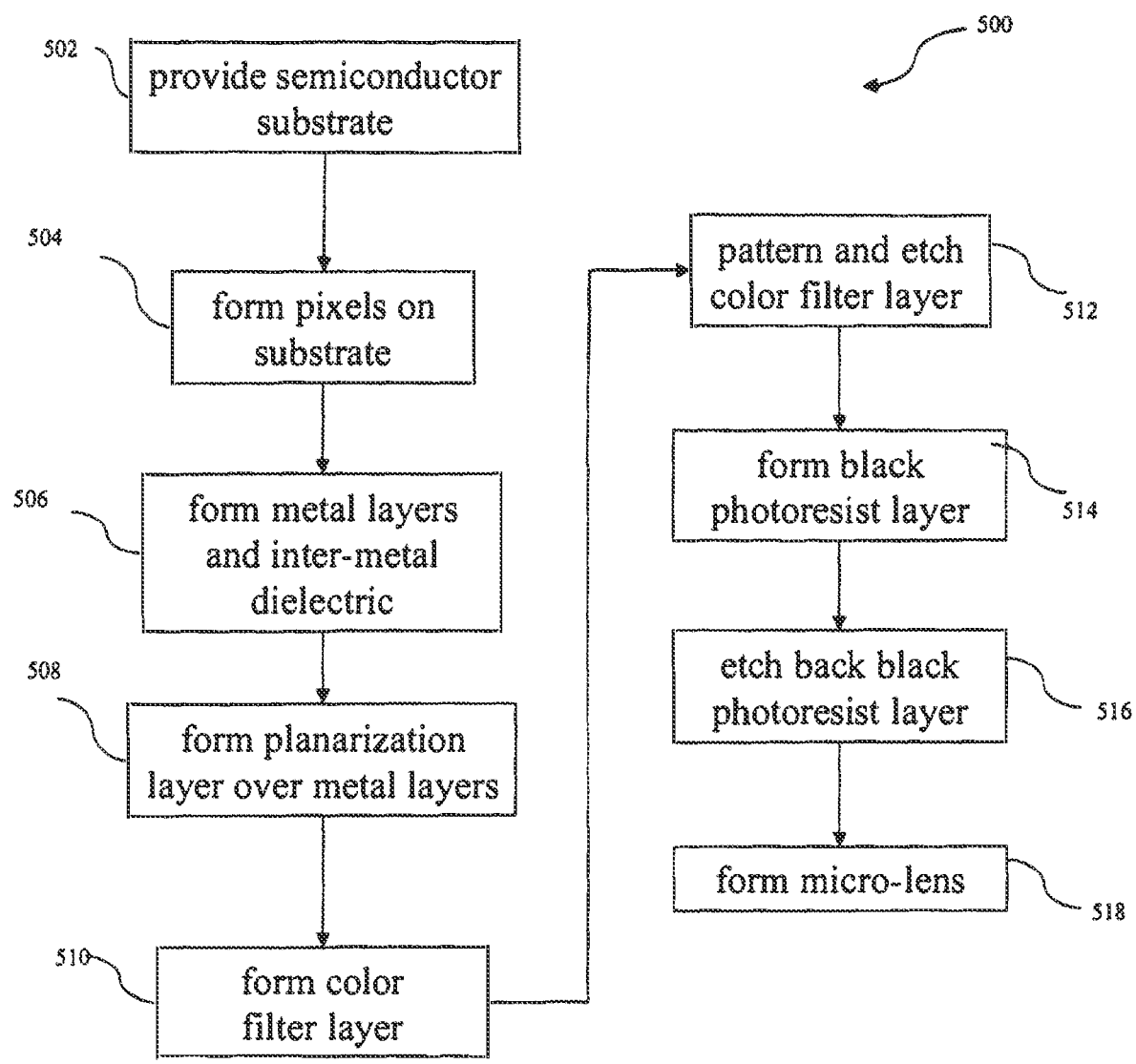
FIG. 5 is a flowchart of a method of making a back-side illuminated sensor according to an alternative embodiment of the present disclosure.

Referring to FIGS. 5, and 6A through 6C, illustrated are a flowchart of a method 500 for making a back-side illuminated image sensor device 600, and cross-sectional views of the image sensor 600 being processed at various stages according to the method 500. The image sensor 600 of FIG. 6 is similar to the image sensor 10 of FIGS. 1-2 except for the features disclosed below. Similar features in FIGS. 6 and 1-2 are numbered the same for clarity. In FIG. 5, the method 500 begins with process 502 in which a substrate 110 may be provided with a front surface 111 and a back surface 112. The substrate 110 may include an epilayer formed thereon. The method 500 continues with process 504 in which a plurality of pixels 102 and 104 may be formed on the substrate 110, each pixel having a light-sensing element 122 and 124 such as a photodiode, and at least one transistor 114 and 116. The process of forming the pixels is known in the art and thus, not described in detail here.

The method 500 continues with process 506 in which interconnect metal layers 130 and 132 and an inter-metal dielectric 134 may be formed over the substrate 110. The process of forming the interconnect metal layers and inter-metal dielectric is known in the art and thus, not described in detail here. The method 500 continues with process 508 in which a planarization layer 602 may be formed over the back surface 112 of the substrate 110. The planarization layer 602 may include silicon oxide. Alternatively, the planarization layer 602 may optionally include silicon nitride, silicon oxynitride, or other suitable material. The planaratization layer 602 may be formed by a suitable deposition or spin-coating process known in the art.

The method 500 continues with process 510 in which a color filter layer may be formed over the planarization layer 602. The color filter layer includes a first color filter 142 for filtering through visible light of a first wavelength (e.g., red, blue, green light) to the first pixel 102, and a second color filter 144 for filtering through visible light of a second wavelength (e.g., red, blue, green light) to the second pixel 104. The color filters 142 and 144 may comprise of a dye-based (or pigment-based) polymer for filtering out a specific frequency band (e.g., desired wavelength of light). Alternatively, the color filters 142 and 144 may optionally comprise of a resin or other organic-based material having color pigments. The process of forming the color filter layer is known in the art, and thus not described in detail here.

Figure 6A:
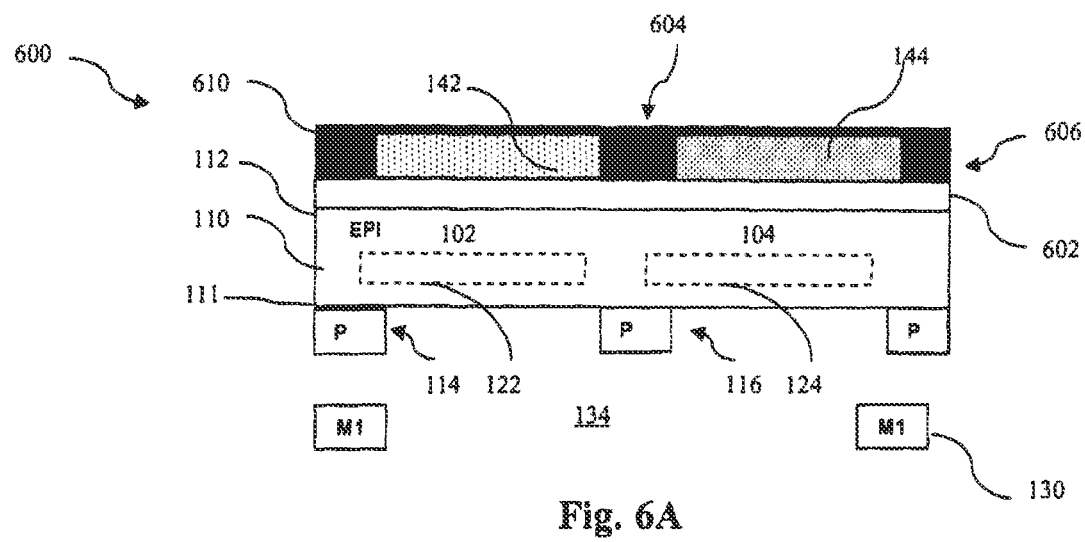
FIGS. 6A, 6B, and 6C are cross-sectional views of the back-side illuminated image sensor being processed according to the method of FIG. 5.

The method 500 continues with process 512 in which the color filter layer may be patterned by photolithography and etched to define open regions 604 and 606 within the color filter layer. The open regions 604 and 606 are located between adjacent color filters 142 and 144. The open regions 604 and 606 may have a width of about 0.2 µm. Alternatively, the open regions 604 and 606 may optionally have a width smaller than 0.2 µm. In FIG. 6A, the method 500 continues with process 514 in which in which a black photoresist layer 610 may be formed over the patterned color filter layer. Accordingly, the black photoresist layer 610 may fill in the regions 604 and 606 between adjacent color filters 142 and 144. The black photoresist layer 610 may be formed by a deposition process, spin-coating process, or other suitable process. Alternatively, other suitable opaque materials may optionally be used instead of the black photoresist.

Figure 6B:
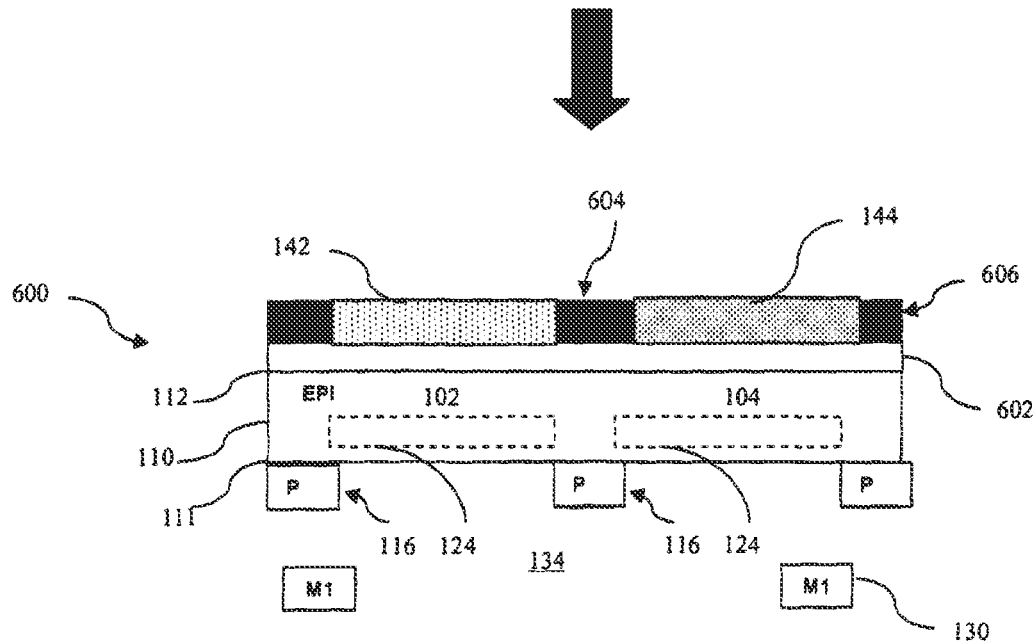
Figure 6C:
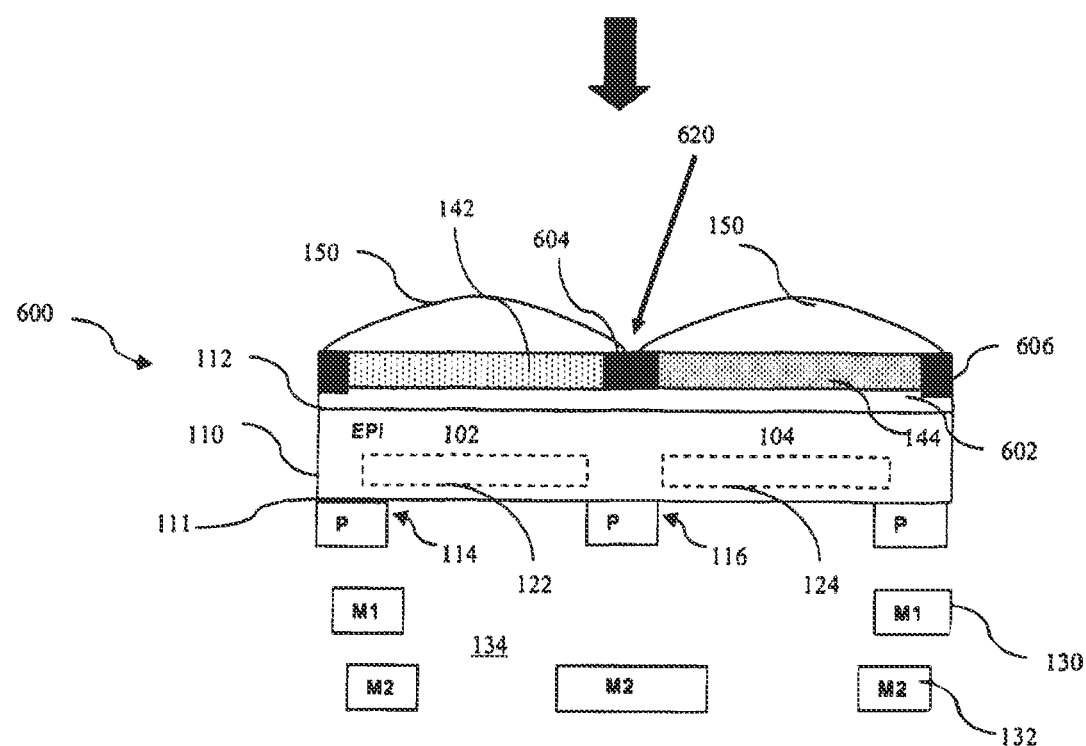

In FIG. 6B, the method 500 continues with process 516 in which the black photoresist layer 610 may be etched back until the color filters 142 and 144 are exposed. The etch back process includes an etching species that selectively removes the black photoresist layer 110 and uses the color filter layer as an etch stop layer. In FIG. 6C, the method 500 continues with process 518 in which a plurality of micro-lens 150 may be formed over the color filter layer. The micro-lens 150 are configured to direct light radiation traveling towards the back surface 112 of the substrate 110 to the corresponding pixels 102 and 104. The micro-lens 150 may be configured such that a region between adjacent micro-lens 150 substantially overlies the regions 604 and 606 within the color filter layer that are filled with the black photoresist.

In operation, the image sensor 600 is designed to receive light radiation traveling towards the back surface 112 of the semiconductor substrate 110. The light is directed towards the color filters 142 and 144 by the micro-lens 150. The light passing through to the color filters 142 and 144 and pixels 102 and 104 may be maximized since the light is not obstructed by various device features (e.g., gates electrodes) or metal features (e.g., the metal layers 130 and 132) overlying the front surface 111 of the substrate 110. The desired wavelength of light (e.g., red, green, blue light) that is allowed to pass through to the respective pixel 102 and 104, induces a photocurrent which may be recorded and processed. There is a region 620 between adjacent micro-lens 150 where the micro-lens exhibit poor light control ability. That is, light traveling through this region 620 may not be directed to the appropriate pixel for processing. However, in the present embodiment, the light traveling through this region 620 may be shielded or blocked by the regions 604 and 606 within the color filter layer that are filled with the black photoresist. As such, the regions 604 and 606 between adjacent color filters 142 and 144 may minimize optical cross-talk between adjacent pixels 102 and 104.

Thus, provided is an image sensor and method for making the same. In one embodiment, an image sensor device includes a semiconductor substrate having a front surface and a back surface; a plurality of pixels formed on the front surface of the semiconductor substrate, each pixel being adapted for sensing light radiation; an array of color filters formed over the plurality of pixels, each color filter being adapted for allowing a wavelength of light radiation to reach at least one of the plurality of pixels; and a plurality of micro-lens formed over the array of color filters, each micro-lens being adapted for directing light radiation to at least one of the color filters in the array. The array of color filters further includes structure adapted for blocking light radiation that is traveling towards a region between adjacent micro-lens. In some embodiments, the array of color filters is formed over the back surface of the substrate. In some other embodiments, the structure includes a black photoresist disposed in a space between adjacent color filters in the array.

In other embodiments, the image sensor device further includes a planarization layer formed between the back surface of the substrate and the array of color filters. In still other embodiments, the structure includes a planatization layer having a transparent portion and an opaque portion, the planarization layer being disposed between the back surface of the substrate and a bottom surface of the array of color filters, the opaque portion being disposed underneath an area between adjacent color filters. In some other embodiments, the opaque portion includes a black photoresist. In other embodiments, the transparent portion is one of a silicon oxide, a silicon nitride, a silicon oxynitride, or combinations thereof. In other embodiments, the structure has a width that is equal to about 0.2 µm. In still other embodiments, the device further includes a plurality of interconnect metal layers formed over the front surface of the substrate; and an inter-metal dielectric disposed between each of the plurality of metal layers.

Also provided is one embodiment of a method for making an image sensor device. The method includes a process of: providing a semiconductor substrate having a front surface and a back surface; forming a plurality of pixels on the front surface of the semiconductor substrate, each pixel being adapted for sensing light radiation; forming an array of color filters over the plurality of pixels, each color filter being adapted for allowing a wavelength of light radiation to reach at least one of the plurality of pixels; and forming a plurality of micro-lens over the array of color filters, each micro-lens being adapted for directing light radiation to at least one of the color filters in the array. The process of forming the array of color filters further includes forming the array of color filters with structure adapted for blocking light radiation traveling towards a region between adjacent micro-lens.

In some embodiments, the process of forming the array of color filters with the structure includes: forming a planarization layer on the back surface of the substrate; patterning the planarization layer to define a space within the planarization layer; forming a layer of an opaque material over the patterned planarization layer; etching back the opaque material until the planarization layer is exposed; and forming a color filter layer over the planarization layer such that the space filled with the opaque material is disposed underneath an area between adjacent color filters. In some embodiments, the process of forming the layer of opaque material includes forming a layer of a black photoresist.

In some other embodiments, the process of forming the array of color filters with the structure includes: forming a planarization layer on the back surface of the substrate; forming a color filter layer over the planarization layer; patterning the color filter layer to define a space between adjacent color filters; forming a layer of an opaque material over the patterned color filter layer; and etching back the opaque material until the color filter layer is exposed. In some embodiments, the process of forming the layer of opaque material includes forming a layer of a black photoresist. In still other embodiments, the method further includes: forming a plurality of metal layers over the front surface of the substrate; and forming an intermetal dielectric between each of the plurality of metal layers.

Also provided is a semiconductor device including a substrate having a front surface and a back surface; a plurality of pixels formed on the front surface of the substrate, each pixel being adapted to sense light radiation directed towards the back surface of the substrate; an array of color filters formed over the back surface of the substrate, each color filter being aligned with one of the plurality of pixels for allowing a wavelength of light radiation to pass through to the one of the plurality of pixels; a plurality of micro-lens formed over the array of color filters, each micro-lens being adapted to direct light radiation to each color filter in the array; and a blocking structure disposed between the back surface of the substrate and the plurality of micro-lens, the blocking structure being adapted to block light radiation traveling towards a region between adjacent micro-lens from reaching the pixels.

In some embodiments, the blocking structure includes a black photoresist disposed in a region between adjacent color filters. In some other embodiments, the blocking structure includes a planarization layer formed between the back surface of the substrate and a bottom surface of the array of color filters, the planarization layer having a black photoresist disposed underneath an area between adjacent color filters. In still other embodiments, the wavelength of light is one of a red light, a green light, and a blue light. In other embodiments, each pixel includes a photodiode and at least one transistor.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. For example, the color filters disclosed may be configured to filter through other colors such as cyan, yellow, and magenta, or other types of light radiation such as infrared (IR), microwave, X-ray, and ultraviolet (UV). Those skilled in the art should also realize that such equivalent constructions do not depart from the spirit and scope of the present disclosure, and that they may make various changes, substitutions and alterations herein without departing from the spirit and scope of the present disclosure.

Several different advantages exist from these and other embodiments. In addition to providing an efficient and cost-effective apparatus and method for reducing optical cross-talk in image sensors, the apparatus and method disclosed herein can easily be integrated with current semiconductor processing equipment and techniques. In addition, the apparatus and method disclosed herein utilizes a black photoresist material that does not exhibit good resolution in photolithography for small feature sizes. As such, the apparatus and method disclosed herein may be implemented even as pixel sizes continue to decrease with emerging technologies.

What is claimed is:

1. A method for forming an image sensor device, the method comprising:
    providing a semiconductor substrate;
    forming pixels on the semiconductor substrate, wherein each of the pixels includes a light-sensing element;
    forming a planarization layer over a first surface of the semiconductor substrate;
    forming a color filter layer on the planarization layer;
    patterning the color filter layer to form open regions within the color filter layer, wherein at least one of the open regions is disposed between a first portion of the color filter layer and a second portion of the color filter layer, and wherein the at least one of the open regions is above and between a first pixel of the pixels and a second pixel of the pixels; and
    forming a black photo-resist layer within the open regions to form a plurality of light-blocking structures, wherein a first light-blocking structure of the plurality of light-blocking structures is disposed in the at least one of the open regions; and
    forming micro-lenses on the color filter layer and interfacing the first light-blocking structure.

2. The method of claim 1, wherein the first surface is a back surface of the semiconductor substrate.

3. The method of claim 1, wherein a plurality of metal layers is formed on a second surface of the semiconductor substrate, the second surface opposing the first surface.

4. The method of claim 1, wherein each of the pixels includes a light-sensing element and a transistor.

5. The method of claim 1, wherein the planarization layer includes silicon nitride.

6. The method of claim 1, wherein the planarization layer includes silicon oxynitride.

7. The method of claim 1, wherein the color filter layer includes a dye-based polymer.

8. The method of claim 1, wherein the color filter layer comprises a resin.

9. The method of claim 1, wherein the first light-blocking structure has a width that is less than or equal to about 0.2 µm.

10. A method for making an image sensor device, comprising:
    providing a semiconductor substrate having a front surface and a back surface;
    forming a plurality of pixels on the front surface of the semiconductor substrate, each pixel of the plurality of pixels being adapted for sensing light radiation;
    forming an array of color filters over the plurality of pixels; and
    forming a plurality of micro-lens over the array of color filters;
    wherein the forming the array of color filters further includes:
        forming the array of color filters, wherein a color filter of the array of color filters is over each pixel of the plurality of pixels;
        forming a structure contacting sidewalls of each color filter of the array of color filters, wherein the structure is adapted for blocking light radiation traveling towards a region between adjacent micro-lens of the plurality of micro-lens, and
        etching the structure to provide an upper surface of the structure coplanar with an upper surface of the array of color filters.

11. The method of claim 1, wherein a second light-blocking structure of the plurality of light-blocking structures is disposed between four micro-lenses of the formed micro-lenses in a top view.

12. The method of claim 1, wherein the forming the micro-lenses on the color filter further includes forming a first micro-lens of the micro-lenses interfacing a first region of the first light-blocking structure and a second micro-lens of the micro-lenses interfacing a second region of the first light-blocking structure.

13. The method of claim 10, wherein the structure directly contacts a bottom surface of at least one of the color filters of the array of color filters.

14. The method of claim 10, wherein forming the structure includes forming a layer of opaque material.

15. The method of claim 14, wherein the opaque material includes a black photoresist.

16. The method of claim 15, wherein forming the structure includes depositing the black photoresist over the upper surface of the array of color filters and etching back the black photoresist to provide the upper surface of the structure coplanar with the upper surface of the array of color filters.

17. The method of claim 10, further comprising:
    forming a plurality of metal layers over the front surface of the semiconductor substrate; and
    forming an inter-metal dielectric between each of the plurality of metal layers.

18. A method comprising:
    providing a semiconductor substrate;
    forming a plurality of light-sensing elements in the semiconductor substrate;
    forming a planarization layer over the plurality of light-sensing elements;
    forming a color filter layer on the planarization layer;
    patterning the color filter layer to form open regions within the color filter layer; and
    forming a black photo-resist layer within the open regions to form light-blocking structures, wherein a first light-blocking structure of the light-blocking structures is vertically aligned between a first light-sensing element of the plurality of light-sensing elements and a second light-sensing element of the plurality of light-sensing elements; and
    forming micro-lenses on the color filter layer and the light-blocking structures, wherein a first portion of a first micro-lens of the micro-lens interfaces the black photo-resist layer.

19. The method of claim 18, wherein a wavelength of light for the color filter layer is one of a red light, a green light, and a blue light.

20. The method of claim 18, wherein a second portion of the first micro-lens of the micro-lenses interfaces the black photo-resist layer, wherein a third portion of the first micro-lens interfaces the color filter layer, and wherein the third portion interposes the first portion and the second portion of the first micro-lens.

\* \* \* \* \*